(12) United States Patent
Oka et al.

(10) Patent No.: US 7,495,287 B2
(45) Date of Patent: Feb. 24, 2009

(54) SEMICONDUCTOR DEVICE AND MANUFACTURING METHOD THEREOF

(75) Inventors: Hideaki Oka, Minwa-machi (JP); Kei Kanemoto, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 199 days.

(21) Appl. No.: 11/649,170

(22) Filed: Jan. 3, 2007

(65) Prior Publication Data

US 2007/0176236 A1    Aug. 2, 2007

(30) Foreign Application Priority Data

Jan. 31, 2006  (JP) .............................. 2006-021979

(51) Int. Cl.
  *H01L 27/01*  (2006.01)
(52) U.S. Cl. ............... 257/347; 257/350; 257/E27.112; 257/E21.32; 438/149
(58) Field of Classification Search ................. 257/347, 257/E27.112
  See application file for complete search history.

(56) References Cited

U.S. PATENT DOCUMENTS 7,361,956 B2 * 4/2008 Oh et al. ..................... 257/347

FOREIGN PATENT DOCUMENTS

JP    2006-156731 A    6/2006
JP    2006-210551 A    8/2006

OTHER PUBLICATIONS

T. Sakai et al., Separation by Bonding Si Islands (SBSI) for LSI Applications, Second International SiGe Technology and Device Meeting, Meeting Abstract, May 2004, pp. 230-231.

* cited by examiner

*Primary Examiner*—Tu-Tu V Ho
(74) *Attorney, Agent, or Firm*—AdvantEdge Law Group, LLC

(57) ABSTRACT

A semiconductor device includes a semiconductor layer formed by epitaxial growth in a first region which is obtained by etching a semiconductor substrate to a predetermined depth, a surface of the semiconductor layer having a same height from the bottom of the semiconductor substrate as a height of a surface of the semiconductor substrate, a buried insulating layer buried between the semiconductor substrate and the semiconductor layer and an element isolation region separating each element region in the semiconductor layer and isolating the semiconductor layer from the semiconductor substrate in plan.

16 Claims, 17 Drawing Sheets

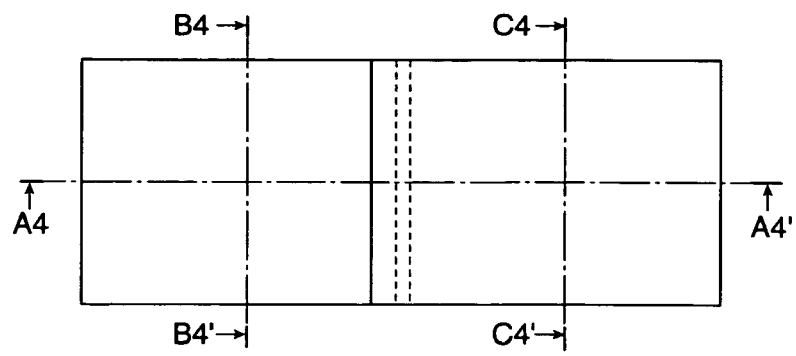
FIG. 4A
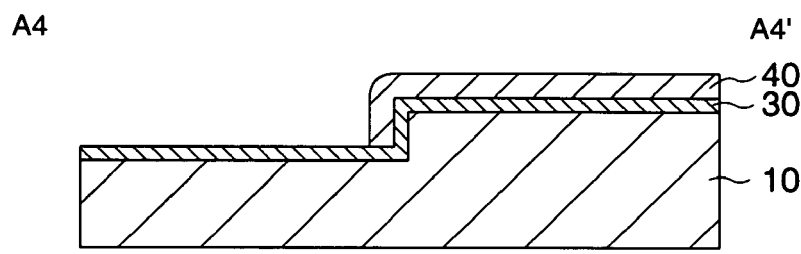
FIG. 4B
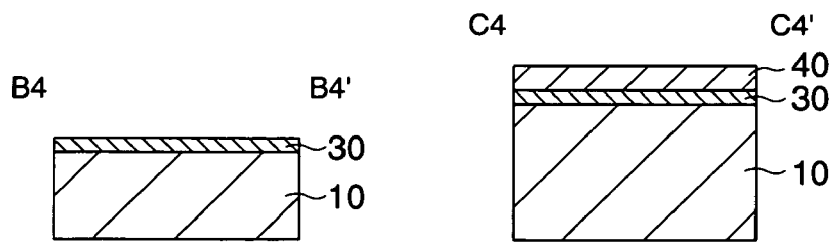
FIG. 4C
FIG. 4D

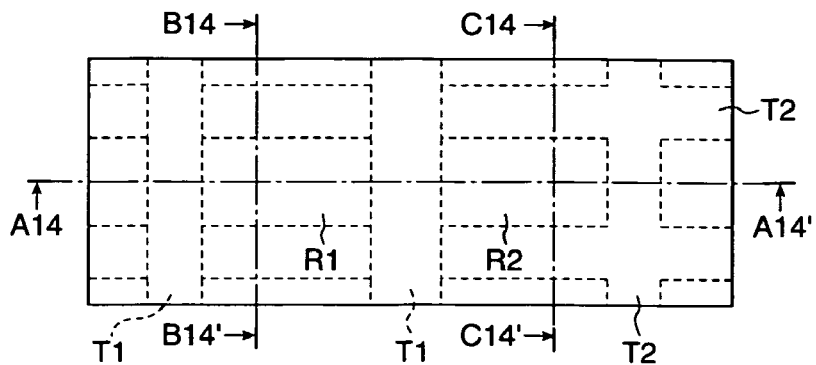
FIG.14A
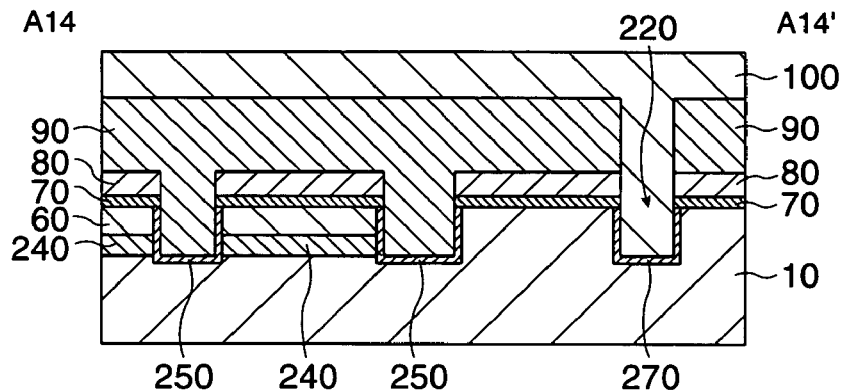
FIG.14B
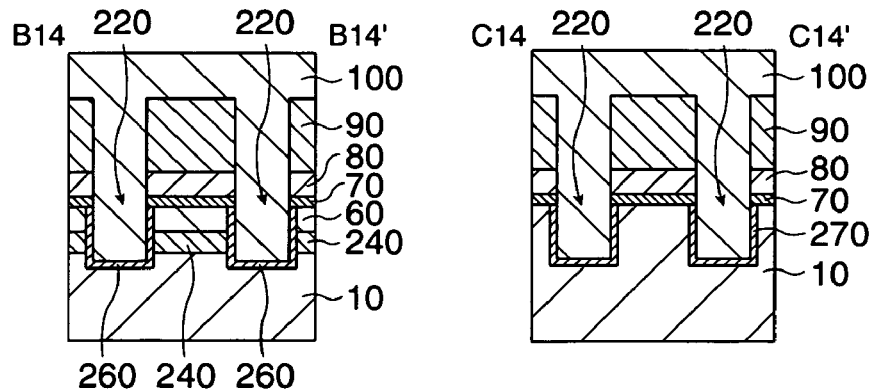
FIG.14C
FIG.14D

SEMICONDUCTOR DEVICE AND MANUFACTURING METHOD THEREOF

BACKGROUND OF THE INVENTION

1. Technical Field

The present invention relates to a semiconductor device in which both a silicon-on-insulator (SOI) structure and a bulk structure are formed on the same substrate and a manufacturing method thereof 2. Related Art A field effect transistor (FET) formed on a silicon-on-insulator (SOI) substrate has attracted attention in terms of its availability that it has advantages such as easiness in element's isolation, latch-up free and a small source-drain junction capacitance. Especially, a fully depleted SOI transistor consumes less power and can operate in high speed. In addition, the fully depleted SOI transistor can be easily driven with a small voltage. For this reason, a lot of researches have been carried out in this field.

*Separation by Bonding Si Islands (SBSI) for LSI Application* (T. Sakai et al, Second International GiGe Technology and Device Meeting, Meeting Abstract, May 2004, Pages: 230-231) is an example of related art. Though bonded substrates and the like have been conventionally used as SOI substrates, the example discloses a method to manufacture a SOI transistor at a reduced cost by forming a SOI structure on a bulk substrate.

According to the aforementioned method, in order to form a SOI structure and a bulk structure on the same substrate, element isolation regions such as a trench structure and a local oxidation of silicon (LOCOS) structure have to be separately formed respectively in the SOI structure and the bulk structure on the semiconductor substrate. This increases the area where the element isolation regions occupy, increasing the size of the chip. Furthermore, the number of the process steps is also increased.

SUMMARY

A semiconductor device according a first aspect of the invention includes a semiconductor layer formed by epitaxial growth in a first region which is obtained by etching a semiconductor substrate to a predetermined depth, a surface of the semiconductor layer having a same height from the bottom of the semiconductor substrate as a height of a surface of the semiconductor substrate, a buried insulating layer buried between the semiconductor substrate and the semiconductor layer, and an element isolation region separating each element region in the semiconductor layer and isolating the semiconductor layer from the semiconductor substrate in plan.

According to the first aspect of the invention, each element region is separated by the groove filled with insulating material so that it is possible to form the SOI structure and an area where should be used as a bulk (hereinafter called "a bulk region") on the same substrate without increasing the size of the chip.

According to a second aspect of the invention, a method of manufacturing a semiconductor device on a semiconductor substrate that has a first element region having a silicon-on-insulator structure (SOI) structure, a second element region having a bulk structure and an element isolation region separating each region, the first region and the second region being provided in a plural number, the method includes:

etching a part of a first area situated next to the first element region in the first element region and/or the element isolation region on the semiconductor substrate to a predetermined depth;

forming a mask layer in an unetched second area other than the etched first area;

forming a first semiconductor layer made of an material that has a larger etching rate than an etching rate of the semiconductor substrate selectively in an unmasked area;

forming a second semiconductor layer made of an material that has a smaller etching rate than the etching rate of the first semiconductor layer on the first semiconductor layer;

forming a first groove in an third area where the first semiconductor layer and the second semiconductor layer are formed in the element isolation region, the first groove penetrating the first semiconductor layer and the second semiconductor layer and exposing the semiconductor substrate;

forming a supporting layer in the first groove and in at least a part of the first element region, the supporting layer supporting the second semiconductor layer on the semiconductor substrate;

forming a second groove in the element isolation region except an area where the first groove is formed, the second groove exposing the first semiconductor layer;

forming a cavity under the second semiconductor layer by removing the first semiconductor layer by etching the first semiconductor layer through the second groove; and forming a buried insulating layer embedded in the cavity through the second groove.

According to the second aspect of the invention, the mask layer is formed in an area other than the area where the SOI structure is formed so that the first semiconductor layer and the second semiconductor layer are formed only in the area where the SOI structure is formed. The second semiconductor layer is supported by an insulating material layer that serves as the supporting member. At the same time, the first semiconductor layer which has a larger etching rate than those of the upper layer (the second semiconductor layer) and the under layer (the semiconductor substrate) is selectively etched so as to form the cavity by contacting (infiltrating) an etching solution with (into) the layer. And an insulating layer is formed in the cavity. Thereby, it is possible to form the SOI structure in any area on the semiconductor substrate.

The first groove which is used to form the supporting member and the second groove through which an etching solution and the like contacts with the cavity can also be used as the element isolation region by filling the grooves with the insulating material. Accordingly, it is possible to form the SOI structure and the bulk structure on the same substrate without increasing the size of the chip and the number of processes.

According to a third aspect of the invention, A method of manufacturing a semiconductor device on a semiconductor substrate that has a first element region having a silicon-on-insulator structure (SOI) structure, a second element region having a bulk structure and an element isolation region separating each element region, the first region and the second region being provided in a plural number, the method comprising:

forming a mask in the second element region on the semiconductor substrate;

etching a part of a first area situated next to the first element region in the first element region and/or the element isolation region to a predetermined depth;

forming a first semiconductor layer made of an material that has a larger etching rate than an etching rate of the semiconductor substrate on the semiconductor substrate and the mask;

forming a second semiconductor layer made of an material that has a smaller etching rate than the etching rate of the first semiconductor layer on the first semiconductor layer;

removing the first semiconductor layer and the second semiconductor layer that exit in an unetched area;

forming a first groove in an second area where the first semiconductor layer and the second semiconductor layer are formed in the element isolation region, the first groove penetrating the first semiconductor layer and the second semiconductor layer and exposing the semiconductor substrate;

forming a supporting layer in the first groove and in at least a part of the first element region, the supporting layer supporting the second semiconductor layer on the semiconductor substrate;

forming a second groove in the element isolation region except an area where the first groove is formed, the second groove exposing the first semiconductor layer;

forming a cavity under the second semiconductor layer by removing the first semiconductor layer by etching the first semiconductor layer through the second groove; and forming a buried insulating layer embedded in the cavity through the second groove.

According to the third aspect of the invention, it is possible to reduce the time for which takes to form the film compared to the case where the first semiconductor layer and the second semiconductor are selectively formed only in the necessary areas and it is also possible to increase process margins while obtaining the semiconductor device in which both the SOI structure and the bulk structure are formed.

It is preferable that the semiconductor substrate be exposed at the bottom of the second groove when the second groove is formed.

In this way, it is possible to contact the whole sectional face of the first semiconductor layer with the etching solution and the like so that the time for forming the cavity can be reduced.

It is also preferable that a third groove be simultaneously formed in the element isolation region that separates each region in the second element region when the second groove exposing the first semiconductor layer is formed.

Since the groove is formed in the second element region in the element isolation region which separates each region simultaneously with the formation of the second groove that exposes the first semiconductor layer, it is possible to reduce the number of processes.

It is also preferable that the semiconductor substrate be etched to a depth substantially same as a sum of thicknesses of the first semiconductor layer and the second semiconductor layer when the part of the first area is etched.

Because the first element region is etched in advance till it has a depth which corresponds to the sum of the film thickness of the first semiconductor layer and the second semiconductor layer, the height of the resulting second semiconductor layer from the substrate bottom becomes substantially same as the height of the second element region where has the bulk structure from the substrate bottom This helps to prevent the size difference due to the unevenness of the substrate surface from occurring during the photolithography process.

It is preferable that the semiconductor substrate be a single-crystalline semiconductor substrate, and the first semiconductor layer and the second semiconductor layer be a single-crystalline semiconductor layer formed by epitaxial growth.

Where a single-crystalline semiconductor substrate is used as the substrate, a single-crystalline semiconductor layer can be formed in the upper layers of the substrate by epitaxial growth. Therefore, it is possible to obtain the semiconductor device including the SOI structure without using the bonding technique and the like.

It is preferable that in the semiconductor substrate and the second semiconductor layer be made of single-crystalline silicon, and the first semiconductor layer be made of a single-crystalline silicon germanium.

By using a fluorinated acid based etching solution, the single-crystalline silicon germanium layer can be etched with a high speed in other words in a high selectivity with the single-crystalline silicon. Accordingly, it is possible to form the cavity while controlling the effect on the second semiconductor layer.

It is preferable that an insulating film be formed on the second semiconductor layer before the first groove is formed.

The insulating film can protect the surface of the second semiconductor layer and prevent the damage from occurring while the first groove is formed so that it is possible to form the SOI structure with fewer defects in the second semiconductor layer.

It is preferable that the buried insulating layer include at least a silicon nitride film.

The silicon nitride film has a high function to prevent oxygen atoms from permeating. Therefore it is possible to prevent the surface (upper face) of the second semiconductor layer from being thermally oxidized and the film thickness from being decreased when the buried insulating layer is formed by thermally oxidizing at least one of the second semiconductor layer and the semiconductor substrate. Accordingly, it is possible to form the SOI structure with a small difference in film thicknesses. In addition to this, the third silicon nitride film can also work as a stopper in a hereinafter-described flattering process by a chemical mechanical planarization (CMP) method.

BRIEF DESCRIPTION OF THE DRAWINGS

The invention will be described with reference to the accompanying drawings, wherein like numbers reference like elements.

FIGS. 4A through 4D show a step in the method of manufacturing a semiconductor device according to the first embodiment.

FIGS. 14A through 14D show a step in the method of manufacturing a semiconductor device according to the first embodiment.

DESCRIPTION OF EXEMPLARY EMBODIMENTS

First Embodiment

A method of manufacturing a semiconductor device according to a first embodiment of the invention will be now described with reference to the accompanying drawings. A single-crystalline silicon germanium, which is a first semiconductor layer, and a single-crystalline silicon layer, which is a second layer, are formed on a single-crystalline silicon substrate which is a semiconductor substrate by epitaxial growth.

Figure 1:
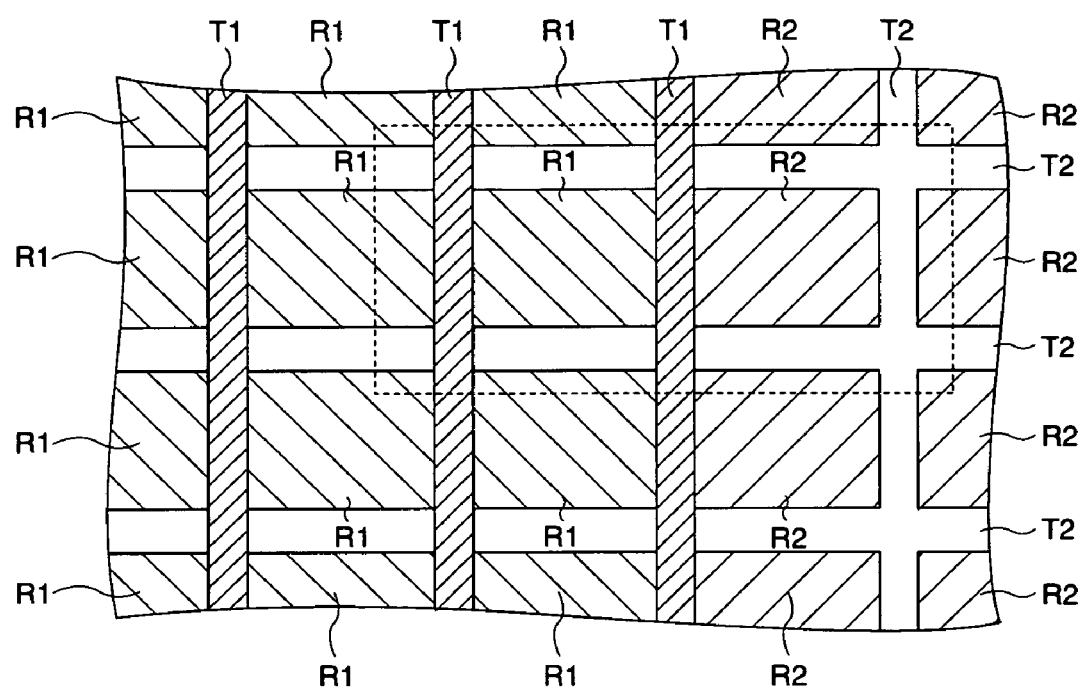
FIG. 1 shows an arrangement of regions on a substrate of a semiconductor device according to an embodiment of the invention.
Figure 2A:
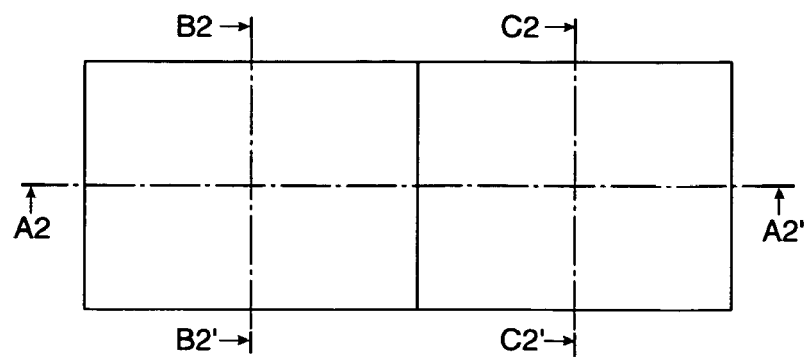
FIGS. 2A through 2D show a step in a method of manufacturing a semiconductor device according to a first embodiment of the invention.
Figure 2B:
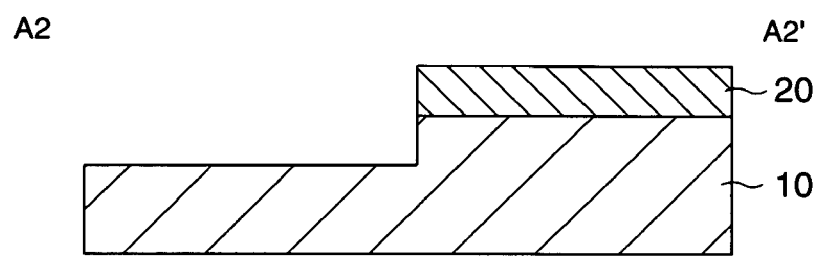
Figures 2C, 2D:
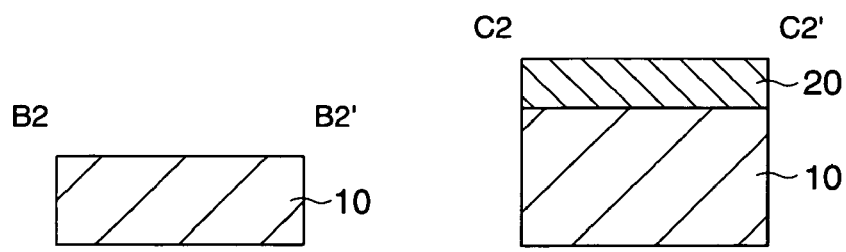

FIG. 1 is a plan view showing an arrangement of regions on a substrate of a semiconductor device according to an embodiment of the invention. The substrate area is divided into a first element region (hereinafter called a "R1 region"), a second element region (hereinafter called a "R2 region") and an element isolation region. The R1 region has a silicon-on-insulator (SOI) structures which are arranged in matrix with gaps therebetween. The R2 region is going to have a bulk structure. The element isolation region separates the R1 region from the R2 region and is formed in a lattice-like pattern. The element isolation region has a first groove forming region (hereinafter called a "T1 region") and a second groove forming region (hereinafter called a "T2 region"). The T1 region includes a part of the boundary line between the R1 region and the element isolation region. In other words, the peripheral line of the R1 region is not included only by either the T1 region or the T2 region but included by both of the T1 region and the T2 region. In this embodiment, a pair of the opposing sides (the sides extending in the longitudinal direction in FIG. 1) of the rectangular R1 region are encompassed in the T1 region. The R2 region can be all surrounded by the T2 regions other than the case where the R2 region is situated next to the R1 region.

A feature of the invention is to make the heights of the above-mentioned two structures which are measured from the substrate bottom same as much as possible and to form the SOI structure and the bulk structure on the same substrate.

FIGS. 2 through 16 show a method of manufacturing a semiconductor device according to the first embodiment. In these figures, the area surrounded by the dashed line in FIG. 1, which is the area where the R1 region (or the first element region that has the SOI structure) is arranged next to the R2 region (or the second element region which should be made to have the bulk structure), is shown including the element isolation regions situated around the area. FIGS. 2A-16A are plan views. FIGS. 2B-16B are sectional views along the corresponding lines A2-A2' . . . A16-A16' in FIGS. 2A-16A. FIGS. 2C-16C are sectional views along the corresponding lines B2-B2' . . . B16-B16' in FIGS. 2A-16A. FIGS. 2D-16D are sectional views along the corresponding lines C2-C2' . . . C16-C16' in FIGS. 2A-16A.

The positions of the R1 region which is the first region that has the SOI structure, the R2 region which is the second region that has the bulk structure, and the groove forming regions that surround the R1 region and the R2 region, are set in advance on the single-crystalline silicon substrate 10 (hereinafter called "substrate") which is the semiconductor substrate. Firstly, a first silicon nitride film 20 and the like that serves as a mask is formed in the R2 region and its peripheral area by a chemical vapor deposition (CVD) method as shown in FIG. 2. The remaining area where the first silicon nitride film 20 is not formed is etched till this area has a depth which is substantially same as the total film thickness of a single-crystalline silicon germanium layer and a single-crystalline silicon layer which are going to be formed in the R1 region in the later process.

Figure 3A:
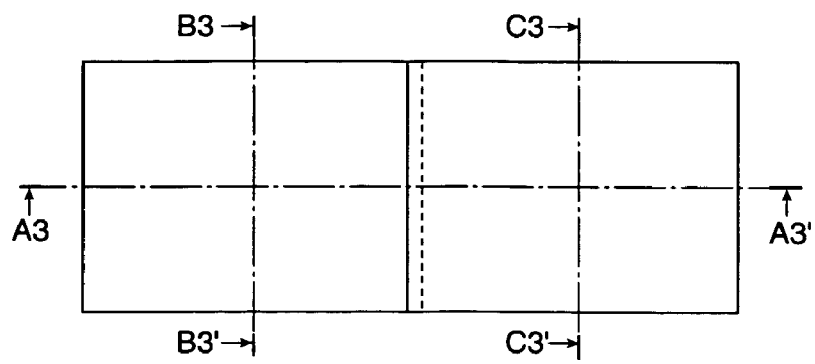
FIGS. 3A through 3D show a step in the method of manufacturing a semiconductor device according to the first embodiment of the invention.
Figure 3B:
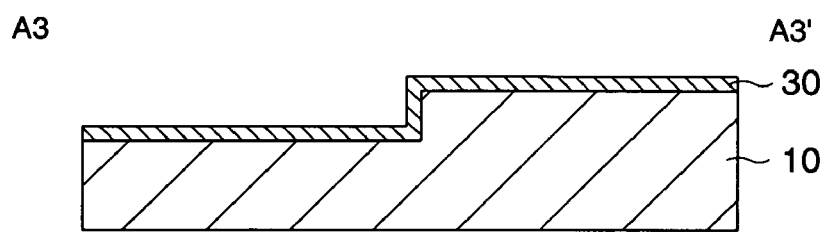
Figures 3C, 3D:
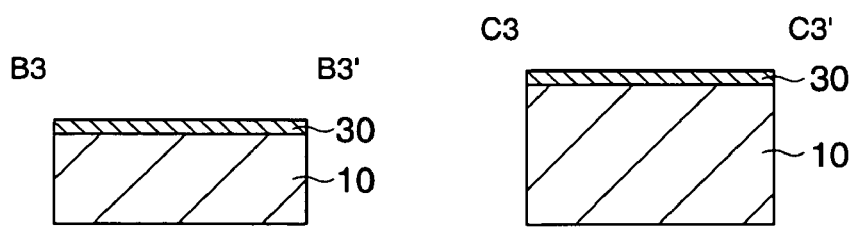

Next, after the first silicon nitride film 20 is removed, a first silicon oxide film 30 which assimilates damages generated during the above-mentioned etching is then formed on the substrate 10 by performing thermal oxidization of the substrate 10 as shown in FIG. 3.

Next, as shown in FIG. 4, a second silicon nitride film 40 is formed in the area where the first silicon nitride film 20 was formed and the area includes a step formed by the process shown in FIG. 2. The second silicon nitride film 40 is formed over the whole surface of the substrate 10 by a CVD method. The above-mentioned area is then covered with photoresist and patterned by anisotropic etching. Consequently, the step is covered by a side-wall as shown in the figure.

Figure 5A:
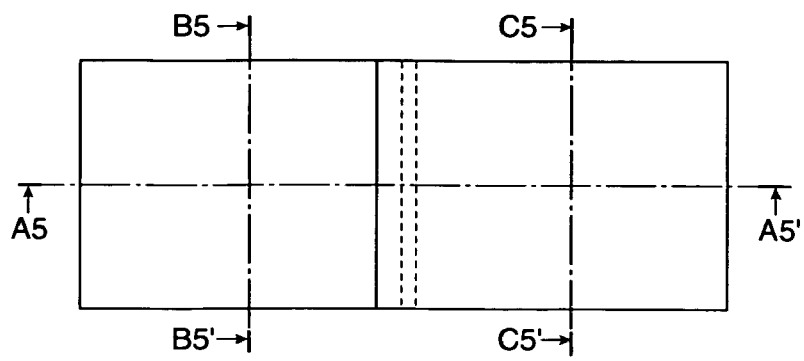
FIGS. 5A through 5D show a step in the method of manufacturing a semiconductor device according to the first embodiment.
Figure 5B:
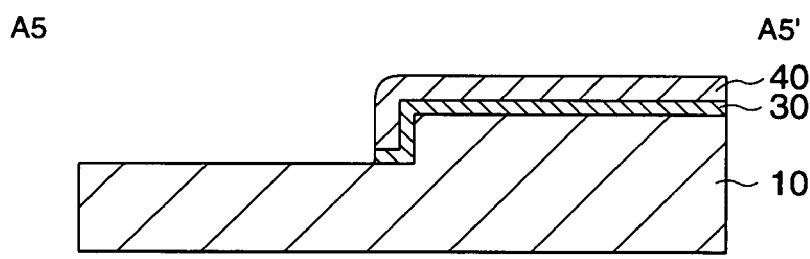
Figures 5C, 5D:
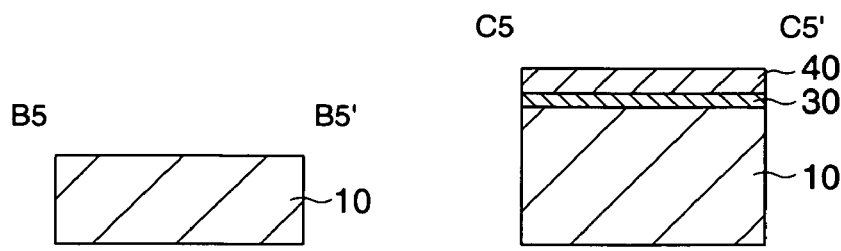

Next, the first silicon oxide film 30 existing in the areas which are not covered with the second silicon nitride film 40 is removed by wet-etching as shown in FIG. 5, exposing the surface of the substrate 10. By using a fluorinated acid based etching solution, the first silicon oxide film 30 can be etched with a high selectivity with the substrate 10 which is the base and the second silicon nitride film 40 which is the mask.

Figure 6A:
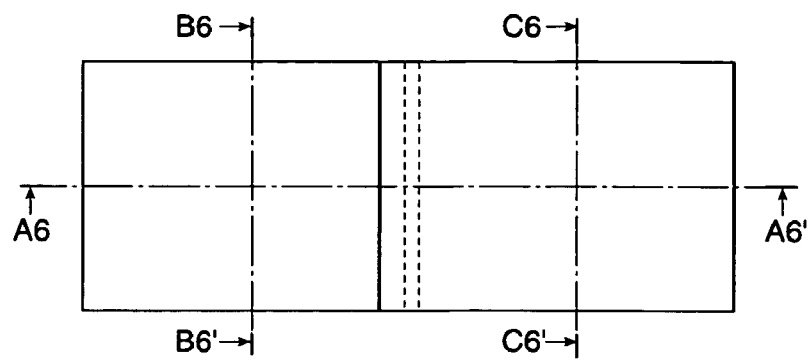
FIGS. 6A through 6D show a step in the method of manufacturing a semiconductor device according to the first embodiment.
Figure 6B:
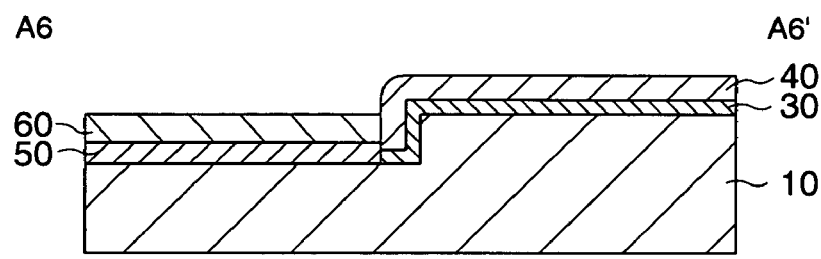
Figures 6C, 6D:
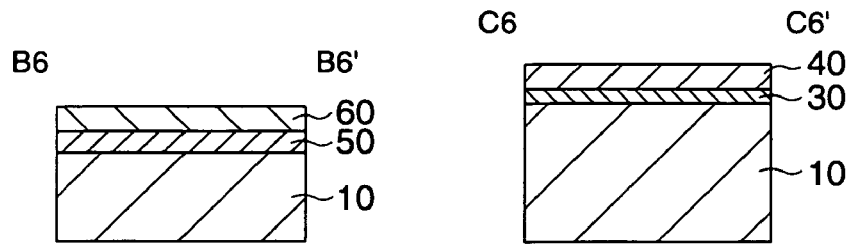

Subsequently, a single-crystalline silicon germanium layer 50 is formed on the exposed surface of the substrate 10 by a selective epitaxial growth as shown in FIG. 6. A single-crystalline silicon film 60 is further formed on the single-crystalline silicon germanium layer 50. Since the exposed area of the substrate 10 was concaved in advance by the etching described above so as to have the depth which corresponds to the total film thickness of the above-mentioned two layers, the surface of the single-crystalline silicon film 60 is substantially leveled in height with the surface of the substrate 10 in the second region.

At this point, crystal defects could occur if the film grows from the side-wall to the lateral direction by the epitaxial growth. However, the second silicon nitride film 40 is blanket-deposited so as to completely cover the first silicon oxide film 30 according to the embodiment. Therefore, it is possible to prevent the crystal defects from being generated. Moreover, a very thin amorphous silicon film and an amorphous silicon germanium film may be formed on the second silicon nitride film 40 which is the mask when the above-mentioned two layers are formed by the epitaxial growth. These films can be easily removed by etching methods by for example introducing a chlorine gas, and this allows the selective epitaxial growth.

Figure 7A:
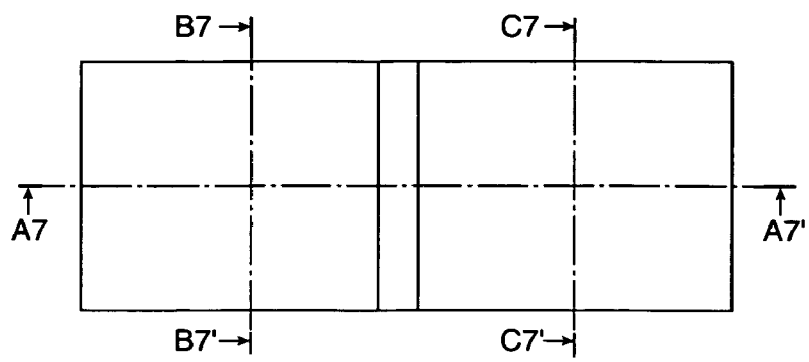
FIGS. 7A through 7D show a step in the method of manufacturing a semiconductor device according to the first embodiment.
Figure 7B:
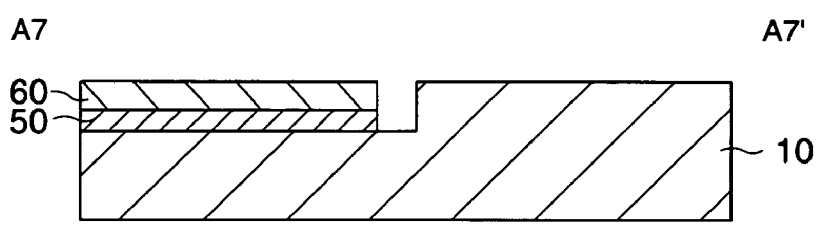
Figures 7C, 7D:
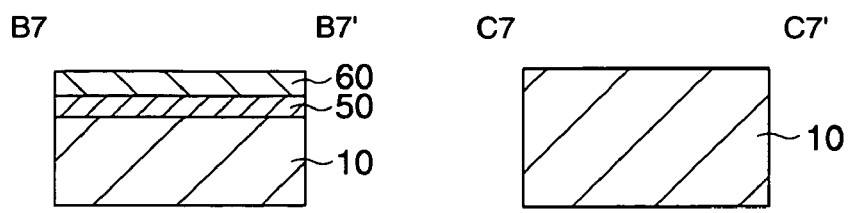

Next, the silicon oxide film 30 and the second silicon nitride film 40 are removed as shown in FIG. 7. The first silicon oxide film 30 can be etched in a high selectivity with the base substrate 10 by using fluorinated acid based etching solutions. The second silicon nitride film 40 can be etched in a high selectivity with the base substrate 10 by using phosphoric acid based etching solutions.

Figure 8A:
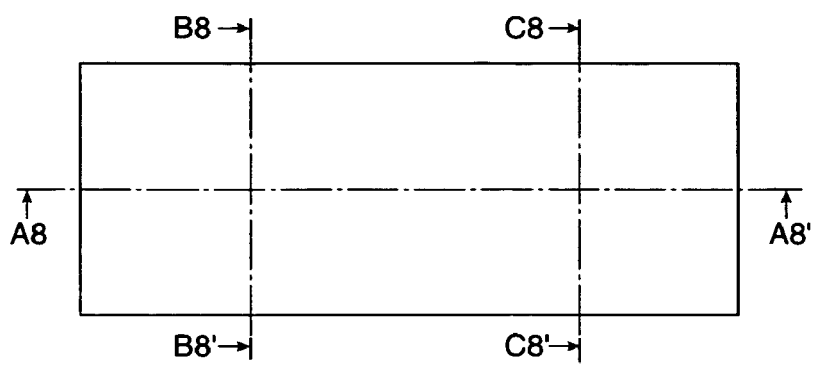
FIGS. 8A through 8D show a step in the method of manufacturing a semiconductor device according to the first embodiment.
Figure 8B:
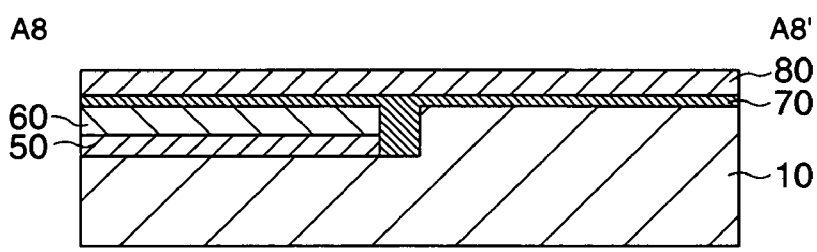
Figures 8C, 8D:
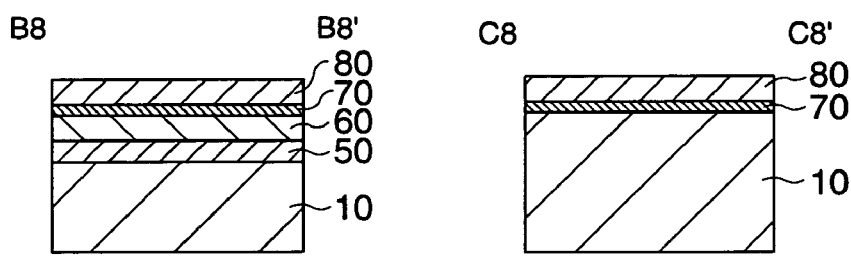

Next, a second silicon oxide film 70 is formed so as to cover the whole surface of the substrate by a CVD method and the like as shown in FIG. 8. A third silicon nitride film 80 is then formed on second silicon oxide film 70 by a CVD method. The third silicon nitride film 80 prevents the single-crystalline silicon film 60 from being oxidized. In addition to this oxidization inhibiting function, the third silicon nitride film 80 also works as a stopper in a hereinafter-described flattering process by a chemical mechanical planarization (CMP) method.

Figure 9A:
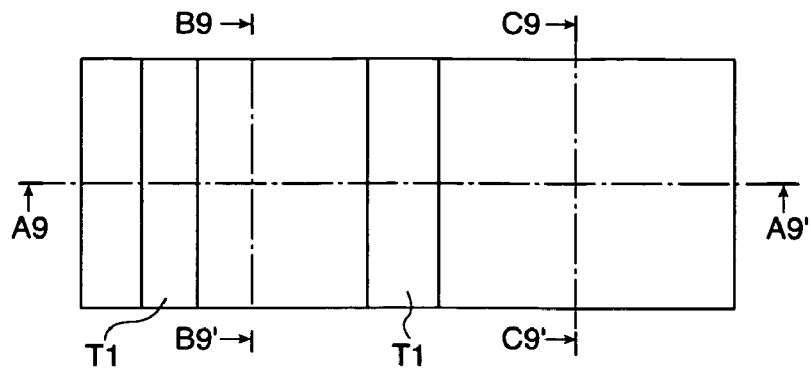
FIGS. 9A through 9D show a step in the method of manufacturing a semiconductor device according to the first embodiment.
Figure 9B:
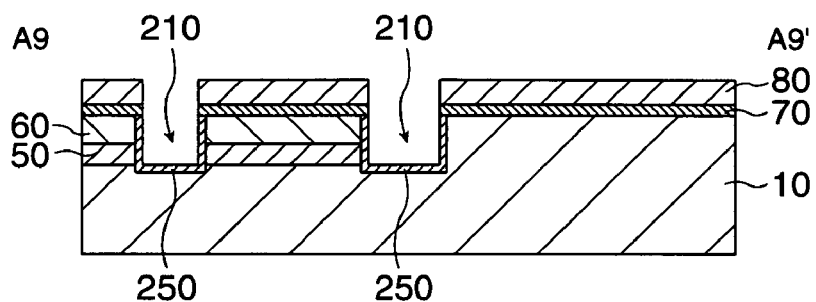
Figures 9C, 9D:
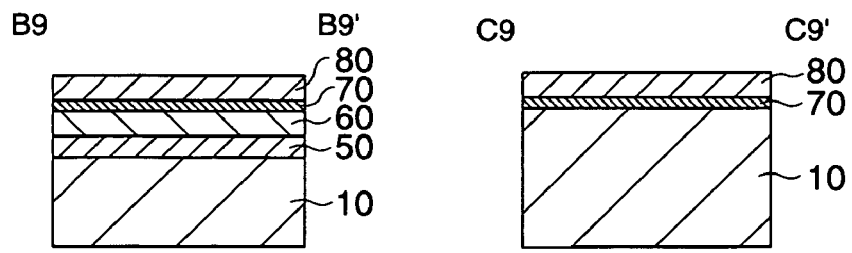

Next, a mask is formed in the T1 region shown in FIG. 1. Subsequently, a first groove 210 that exposes a part of the substrate 10 is then formed by removing the third silicon nitride film 80, the second silicon oxide film 70, the single-crystalline silicon film 60 and the single-crystalline silicon germanium layer 50 by a dry-etching method as shown in FIG. 9. When the first groove 210 is formed, the etching can be stopped at the surface of the substrate 10 or a part of substrate face may be allowed to be etched. The first grooves 210 are formed in such a way that they linearly extend in substantially parallel with each other and they situate between the two adjacent R1 regions and between the R1 region and the R2 region. The first groove 210 is not formed between the two adjacent R2 regions and the first grooves 210 do not cross each other.

Having formed the first groove 210, a oxide film 250 is formed by thermally oxidizing the side walls of the single-crystalline silicon film 60 and the single-crystalline silicon germanium layer 50, which are formed by the formation of the first groove 210, and the exposed surface (the bottom and the side faces of the first groove 210) of the single-crystalline silicon substrate 10.

Here, a cap layer can be formed before the thermal oxidation. For example, a silicon oxide film, a silicon film and the like can be used as the cap layer. In this case, the cap layers are formed on the side walls of the single-crystalline silicon film 60 and the single-crystalline silicon germanium layer 50, and a part of the single-crystalline silicon film 60 and the single-crystalline silicon germanium layer 50 is then thermally oxidized. By forming the cap layer before conducting the thermal oxidation, it is possible to prevent the constituents of the single-crystalline silicon germanium layer 50 from being diffused outside and a semiconductor/oxide film interface which has a low interface state can be formed at least on the sidewalls of the single-crystalline silicon film 60. At the same time, it is possible to avoid the contamination of the peripheral area by the diffused constituents of the single-crystalline silicon germanium layer 50.

Figure 10A:
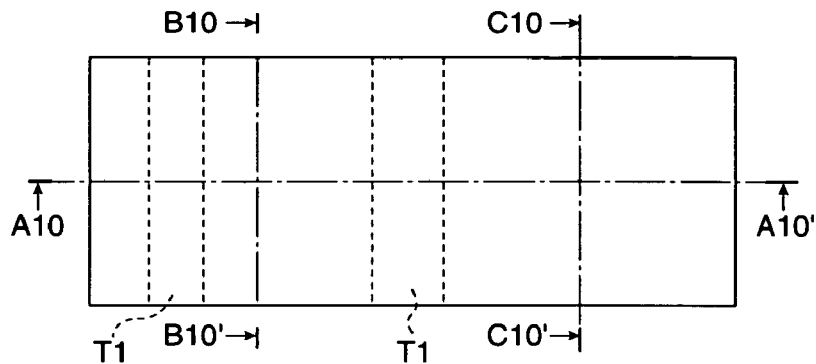
FIGS. 10A through 10D show a step in the method of manufacturing a semiconductor device according to the first embodiment.
Figure 10B:
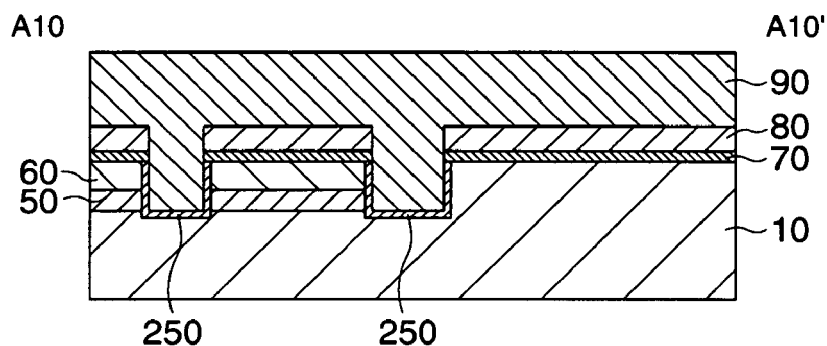
Figures 10C, 10D:
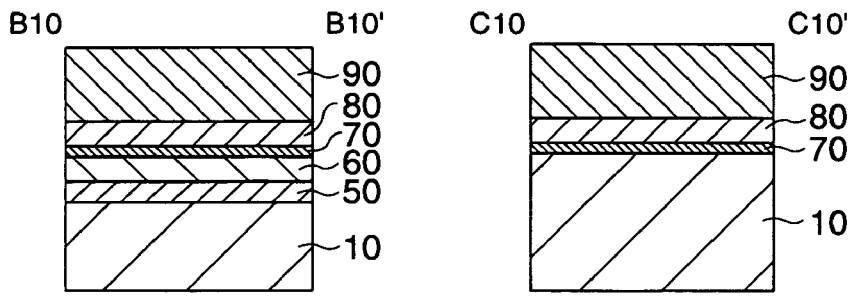

Next, a supporting layer 90 made of a silicon oxide film is formed so as to cover the whole surface of the substrate 10 as well as the inner face of the first groove 210 by a CVD method as shown in FIG. 10. The supporting layer 90 should support the single-crystalline silicon film 60 while keeping the layer flat and controlling the deformation of the layer. Therefore, it is preferable that the film thickness of the supporting layer 90 be 400 nm or more in terms of mechanical strength. The supporting layer 90 should be made of a material with which the single-crystalline silicon germanium layer 50 can be selectively etched in a hereinafter described cavity formation process. For example, the supporting layer 90 can be made of a silicon nitride film and a poly-crystalline silicon film in addition to the above-mentioned silicon oxide film.

Figure 11A:
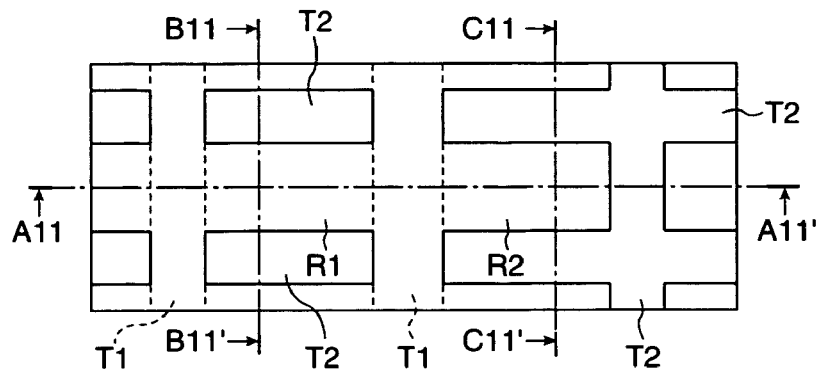
FIGS. 11A through 11D show a step in the method of manufacturing a semiconductor device according to the first embodiment.
Figure 11B:
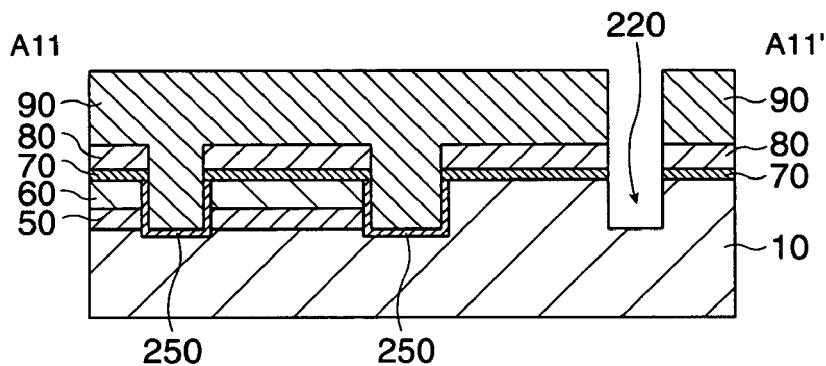
Figures 11C, 11D:
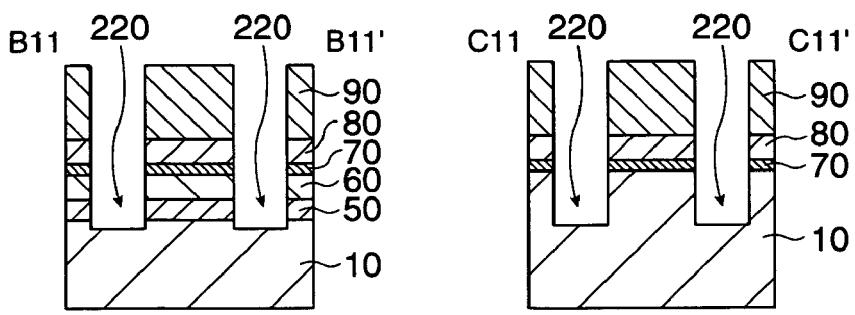

Next, a second groove 220 which exposes the substrate 10 is formed in the T2 region, as shown in FIG. 11. In the T2 regions which situate next to the R1 regions, the substrate 10 is exposed by patterning the supporting layer 90, the third silicon nitride film 80, the second silicon oxide film 70, the single-crystalline silicon film 60 and the single-crystalline silicon germanium layer 50 by a photolithography method.

In the same manner, in the T2 regions which situate next to the R2 regions, the second groove 220 is formed by patterning the supporting layer 90, the third silicon nitride film 80, the second silicon oxide film 70 and the substrate 10 by a photolithography method. Because the etching rate of the single-crystalline silicon germanium is substantially same as that of the single-crystalline silicon which forms the substrate 10, the depths of the second grooves 220 formed in the both regions will become substantially same.

In the region next to the R1 region, the etching is not necessarily performed till the substrate 10 is exposed but can be stopped at a certain depth in the single-crystalline silicon germanium layer 50. In this case, the time to expose the surface of the substrate 10 to an etching solution (or an etching gas) for selectively etching and removing the single-crystalline silicon germanium layer 50 can be reduced because the substrate 10 is not exposed in the second grooves 220. Accordingly, it is possible to prevent the substrate 10 of the bottom of the second grooves 220 from being over-etched.

Figure 12A:
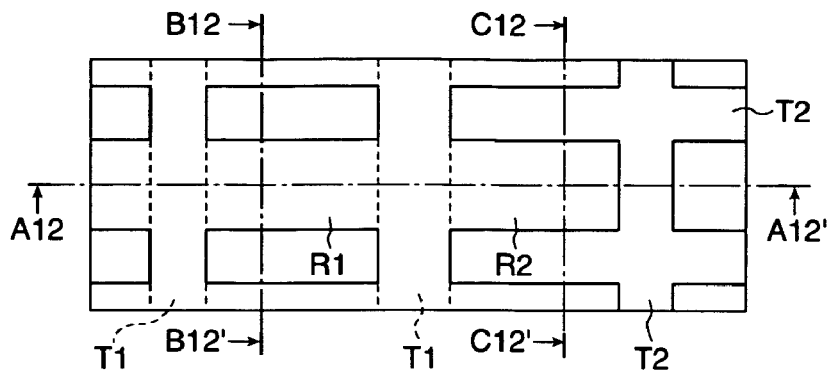
FIGS. 12A through 12D show a step in the method of manufacturing a semiconductor device according to the first embodiment.
Figure 12B:
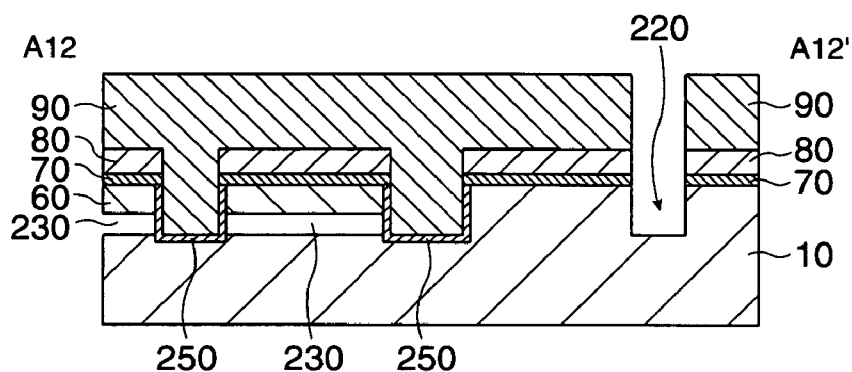
Figures 12C, 12D:
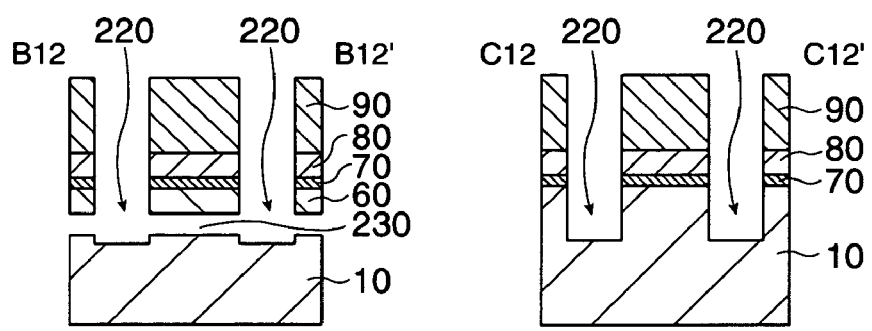

Next, as shown in FIG. 12, a cavity 230 is formed between the single-crystalline silicon film 60 and the substrate 10 by etching the single-crystalline silicon germanium layer 50 by contacting the single-crystalline silicon germanium layer 50 with an etching solution through the second groove 220. When a fluorinated nitric acid (a mixture of fluorinated acid, nitric acid and water) is used as the etching solution for the single-crystalline silicon germanium, the single-crystalline silicon germanium layer can be etched with a high selectivity ratio with the single-crystalline silicon. In this way, it is possible to form the cavity 230 without decreasing the film thickness of the single-crystalline silicon film 60.

Here, the supporting layer 90 is formed in first groove 210 and on the upper face of the single-crystalline silicon film 60 so that the single-crystalline silicon film 60 is suspended by the supporting layer 90. Moreover, the second groove 220 orthogonally crosses the first groove 210 so that it is possible to contact the single-crystalline silicon germanium layer 50 under the single-crystalline silicon film 60 with the etching solution. Accordingly, the cavity 230 can be formed between the single-crystalline silicon film 60 and the substrate 10 without impairing the quality of the single-crystalline silicon film 60.

As an etching solution for the single-crystalline silicon germanium layer 50, for example, a fluorinated nitric acid-hydrogen peroxide-water mixture, an ammonia hydrogen peroxide-water mixture, a fluorinated acetic acid-hydrogen peroxide-water mixture and the like can be used. The etching can be any type of etching including the wet-etching.

Furthermore, the single-crystalline silicon germanium layer 50 can be made porous by for example an anodic oxidation before the single-crystalline silicon germanium layer 50 is selectively etched and removed. Alternatively, the single-crystalline silicon germanium layer 50 can be made amorphous by ion injections and the like. Moreover, the substrate 10 may be a P-type single-crystalline silicon substrate. In this way, the etching rate of the single-crystalline silicon germanium layer 50 and its selectivity with the substrate 10 can be increased.

Figure 13A:
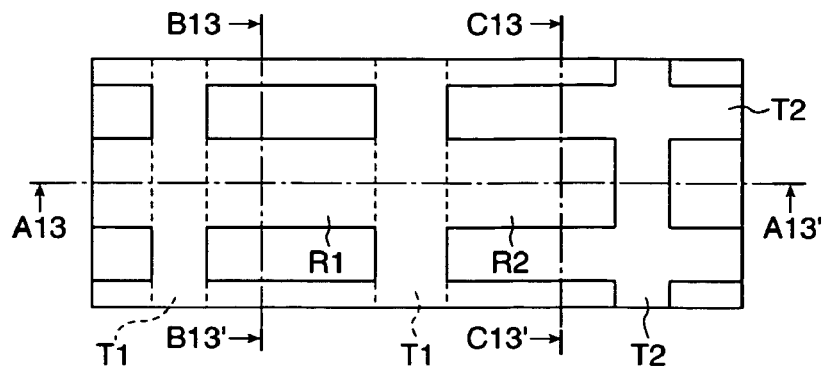
FIGS. 13A through 13D show a step in the method of manufacturing a semiconductor device according to the first embodiment.
Figure 13B:
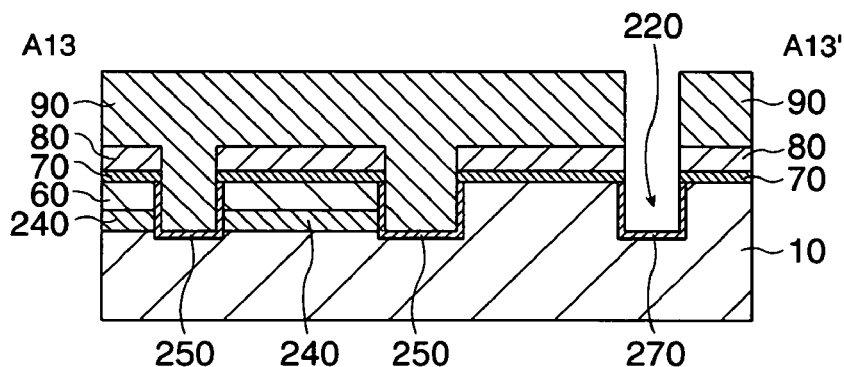
Figures 13C, 13D:
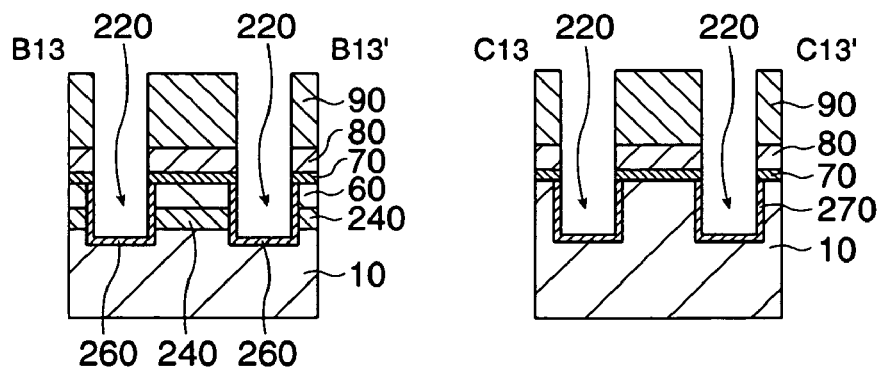

Next, a buried insulating layer 240 made of an oxide silicon is formed in the cavity 230 by performing thermal oxidation of the substrate 10 and the single-crystalline silicon film 60 which sandwich the cavity 230 as shown in FIG. 13. At this point, the side walls of the single-crystalline silicon film 60 and the surface of the second groove 220 are simultaneously oxidized, and an oxide film 260 and an oxide film 270 are formed respectively on the side walls of the single-crystalline silicon film 60 and on the surface of the second groove 220.

On the other hand, the second silicon oxide film 70 and the third silicon nitride film 80 have been formed on the top surface of the single-crystalline silicon film 60 so that the surface (top face) of the single-crystalline silicon film 60 will not be thermally oxidized during the forming process of the buried insulating layer 240. This prevents the film thickness of the single-crystalline silicon film 60 from being reduced.

Where the buried insulating layer 240 is formed, it is preferred that a low-temperature wet oxidation which can be a reaction-rate controlling factor be performed since it improves the embedment of the buried insulating layer. Moreover, the buried insulating layer 240 can be formed in such a way that either it completely fills the cavity 230 or a part of the cavity remains. The buried insulating layer 240 can be formed by forming an insulating film within the cavity 230 alternatively by a CVD method instead of the thermal oxidation. In this way, it is possible to prevent the single-crystalline silicon film 60 which forms a semiconductor element from being reduced, and it is also possible to use other materials than the oxide silicon to form the insulating layer. Consequently, the parasitic capacitance on the back side of the single-crystalline silicon film 60 can be reduced by making the buried insulating layer thicker or selecting low dielectric materials.

Next, as shown in FIG. 14, a third silicon oxide film 100 is formed so as to cover the whole face of the single-crystalline silicon substrate 10 including the inner faces of the second groove 220 and the upper face of the supporting layer 90.

Figure 15A:
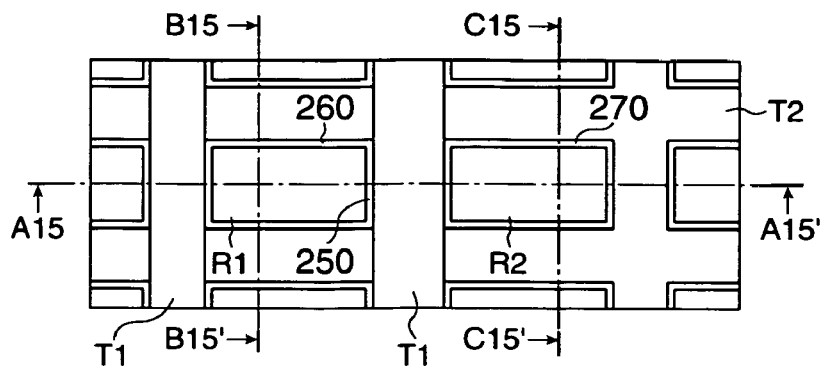
FIGS. 15A through 15D show a step in the method of manufacturing a semiconductor device according to the first embodiment.
Figure 15B:
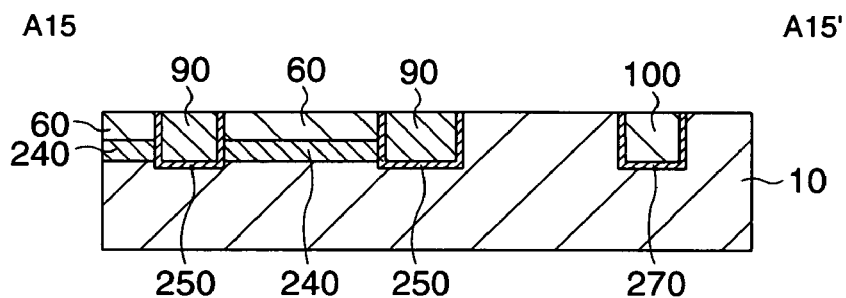
Figures 15C, 15D:
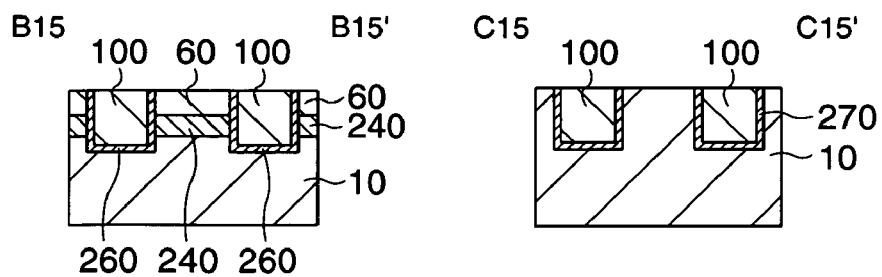
Figure 16A:
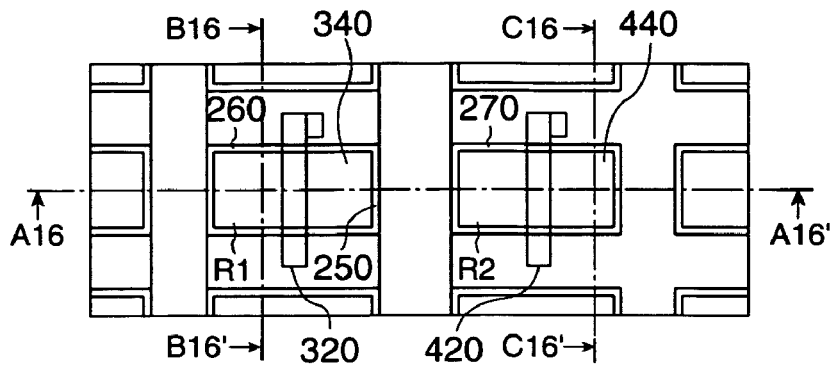
FIGS. 16A through 16D show a step in the method of manufacturing a semiconductor device according to the first embodiment.
Figure 16B:
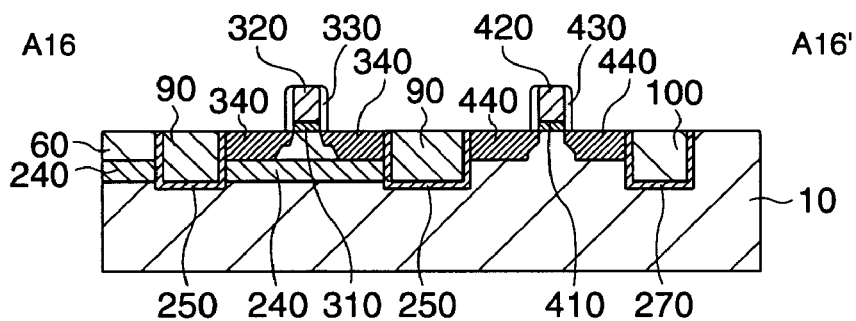
Figures 16C, 16D:
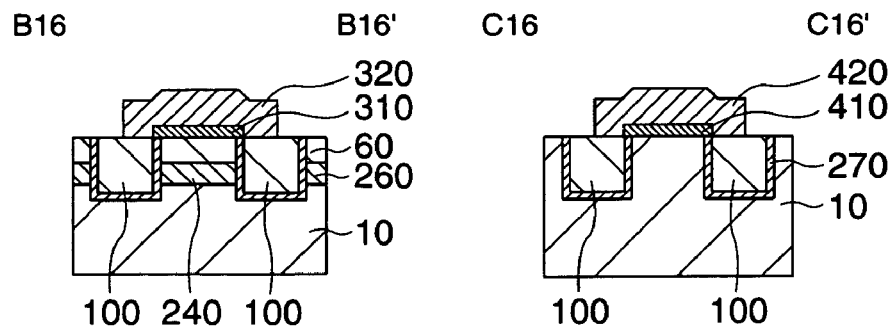

The third silicon oxide film 100 and the like are then removed so as to expose the single-crystalline silicon film 60 and the substrate 10 as shown in FIG. 15. Firstly, the third silicon oxide film 100 and the supporting layer 90 are removed by a CMP method or the like. Subsequently, the third silicon nitride film 80 and the second silicon oxide film 70 are removed by wet etching, and the single-crystalline silicon film 60 is exposed in the R1 region and the substrate 10 is exposed in the R2 region.

Finally, a semiconductor element is formed in the R1 region and the R2 region as shown in FIG. 16. Gate insulating films 310, 410 are firstly formed on the surfaces of the single-crystalline silicon film 60 and the single-crystalline silicon substrate 10 by performing thermal oxidation of the surfaces of the single-crystalline silicon film 60 and the single-crystalline silicon substrate 10. A poly-crystalline silicon layer is subsequently formed above the single-crystalline silicon film 60 and the single-crystalline silicon substrate 10 on which the gate insulating films 310, 410 are formed by a CVD method and the like. The poly-crystalline silicon layer is then patterned by a photolithography method and the like so as to form gate electrodes 320, 420.

Secondly, lightly doped drain (LDD) layers which are lightly doped layers are formed respectively on the sides of the gate electrodes 320, 420 by performing ion injection which injects impurities such as As, P and B into the single-crystalline silicon layer 60 (the single-crystalline silicon substrate 10) by using the gate electrodes 320, 420 as masks. An insulating layer is formed on the gate electrodes 320, 420 by a CVD method and the insulating layer is then etched back by performing an anisotropic etching such as reactive ion etching (RIE) so as to form side-walls 330, 430. Subsequently, source/drain layers 340, 440 which are highly doped layers provided respectively on the sides of the sidewalls by performing ion injection which injects impurities such as As, P and B into the single-crystalline silicon layer 60 and the single-crystalline silicon substrate 10 as using the gate electrodes 320, 420 and the side-walls 330, 430 as masks. Alternatively, the LDD layers and the source/drain layers may be separately formed respectively in the SOI forming region and the bulk forming region under best suited conditions for each layer.

As described above, according to the embodiment of the invention, the single-crystalline silicon germanium layer 50 is sandwiched by the single-crystalline silicon layer 60 and the single-crystalline silicon substrate 10 in a predetermined area of the semiconductor substrate. The cavity 230 is then formed under the single-crystalline silicon layer 60 by utilizing the difference in etching rates between the single-crystalline silicon and the single-crystalline silicon germanium. The SOI structure is formed by filling the cavity with the buried insulating layer 240. Therefore, it is possible to form the SOI element and the bulk element on the same substrate without using a SOI substrate.

Furthermore, according to the embodiment, the first groove 210 which is used to form the supporting layer 90 supporting the single-crystalline silicon layer 60 is utilized as an element isolation member. In addition, the second groove 220 is utilized as an etchant introducing part which is used to etch the single-crystalline silicon germanium layer 50 in order to form the cavity 230. At the same time, the second groove 220 is used as the element isolation member situated between the two R1 regions, the two R2 regions, and between the R1 region and the R2 region. Accordingly, it is possible to prevent the production cost and the number of the processes from being increased while forming both the SOI structure and the bulk structure on the same substrate.

Moreover, according to the embodiment, the height of the resulting single-crystalline silicon layer 60 from the substrate bottom becomes substantially same as the height of the bulk structure region (the R2 region) from the substrate bottom in the end because the first region (the R1 region) where the SOI structure is formed is etched in advance till it has a depth which corresponds to the sum of the film thickness of the single-crystalline silicon germanium layer 50 and the single-crystalline silicon layer 60. This helps to prevent the size difference due to the unevenness of the substrate surface from occurring during the photolithography process whereby the gate electrodes and the like are formed.

Furthermore, this controls inclinations attributable to the level difference among the regions from being formed in the element isolation region which separates the SOI structure region from the bulk structure region.

Second Embodiment

The method of manufacturing a semiconductor device according to a second embodiment of the invention will now be described with reference to FIGS. 17 through 20. FIGS. 17 through 20 are sectional views showing the method of manufacturing a semiconductor device according to the second embodiment and correspond to the sectional views of FIGS. 2B through 16B which illustrate the manufacturing method of the first embodiment.

Figure 17:
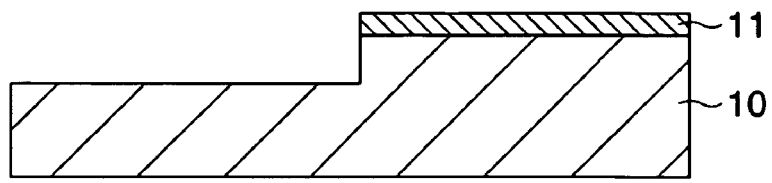
FIG. 17 shows a step in a method of manufacturing a semiconductor device according to a second embodiment of the invention.

Firstly, a base silicon nitride film 11 (hereinafter called just a "silicon nitride film") is formed in the R2 region on the substrate 10 as shown in FIG. 17. The area including at least the R1 region is then etched till it has a depth substantially same as the sum of the film thicknesses of the single-crystalline silicon germanium layer and the single-crystalline silicon layer which are going to be formed later in the R1 region.

Figure 18:
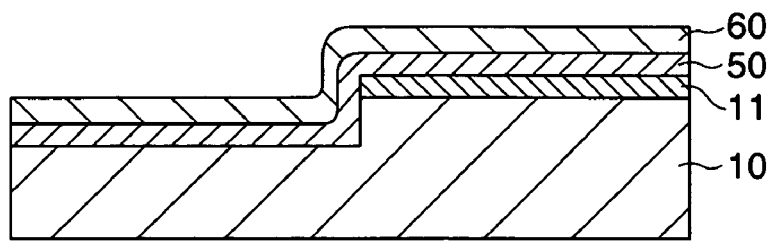
FIG. 18 shows a step in the method of manufacturing a semiconductor device according to the second embodiment of the invention.

Next, the single-crystalline silicon germanium film 50 is formed on the substrate 10 and the silicon nitride film 11 by an epitaxial growth method as shown in FIG. 18. On top of it, the single-crystalline silicon film 60 is further formed. At this point, the silicon germanium film and the silicon film on the silicon nitride film 11 are made single-crystal.

Figure 19:
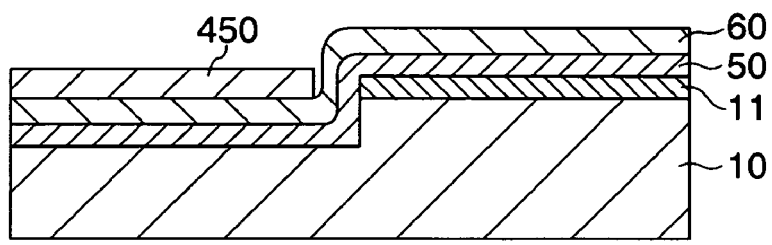
FIG. 19 shows a step in the method of manufacturing a semiconductor device according to the second embodiment of the invention.

Next, a photomask 450 is formed in the above-mentioned area including the R1 region by photolithography as shown in FIG. 19.

Figure 20:
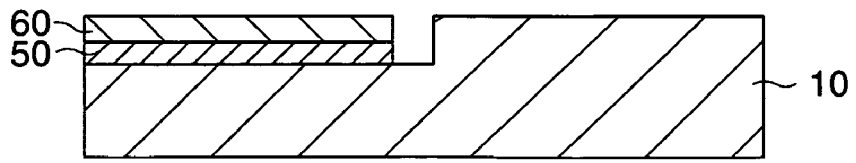
FIG. 20 shows a step in the method of manufacturing a semiconductor device according to the second embodiment.

Subsequently, the silicon film 60 and the silicon germanium film 50 which are not covered with the photomask 450 are removed, and the photomask 450 and the silicon nitride film 11 are removed thereafter as shown in FIG. 20. Following steps are the same as those of the first embodiment shown in FIGS. 8 through 16. By performing these steps, the SOI structure and the bulk structure are formed on the same substrate 10 and the semiconductor device is formed in both regions.

According to this embodiment, it is possible to reduce the time for which takes to form the film by the epitaxial growth and to increase process margins while obtaining the semiconductor device in which both the SOI structure and the bulk structure are formed.

Modification Example

The first grooves 210 are formed in parallel on the substrate 10 and they have the shape like a belt that couples the R1 regions in the above-described first and second embodiments. However, the first grooves 210 can be formed in any shape, for example, a hole provided respectively next to one side of each rectangular element region as long as the first grooves 210 can support the single-crystalline silicon film 60 through the supporting layer 90. In this case, the second groove 220 will have the shape which corresponds to the configuration of the element isolation region but the hole is eliminated from it.

What is claimed is:

1. A method of manufacturing a semiconductor device on a semiconductor substrate that has a first element region having a silicon-on-insulator structure (SOI) structure, a second element region having a bulk structure and an element isolation region separating each region, the first region and the second region being provided in a plural number, the method comprising:

etching a part of a first area situated next to the first element region in the first element region and/or the element isolation region on the semiconductor substrate to a predetermined depth;

forming a mask layer in an unetched second area other than the etched first area;

forming a first semiconductor layer made of a material that has a larger etching rate than an etching rate of the semiconductor substrate selectively in an unmasked area;

forming a second semiconductor layer made of a material that has a smaller etching rate than the etching rate of the first semiconductor layer on the first semiconductor layer;

forming a first groove in a third area where the first semiconductor layer and the second semiconductor layer are formed in the element isolation region, the first groove penetrating the first semiconductor layer and the second semiconductor layer and exposing the semiconductor substrate;

forming a supporting layer in the first groove and in at least a part of the first element region, the supporting layer supporting the second semiconductor layer on the semiconductor substrate;

forming a second groove in the element isolation region except an area where the first groove is formed, the second groove exposing the first semiconductor layer;

forming a cavity under the second semiconductor layer by removing the first semiconductor layer by etching the first semiconductor layer through the second groove; and forming a buried insulating layer embedded in the cavity through the second groove.

2. The method of manufacturing a semiconductor device according to claim 1, wherein the semiconductor substrate is exposed at the bottom of the second groove when the second groove is formed.

3. The method of manufacturing a semiconductor device according to claim 1, wherein a third groove is simultaneously formed in the element isolation region that separates each region in the second element region when the second groove exposing the first semiconductor layer is formed.

4. The method of manufacturing a semiconductor device according to claim 1, wherein the semiconductor substrate is etched to a depth substantially same as a sum of thicknesses of the first semiconductor layer and the second semiconductor layer when the part of the first area is etched.

5. The method of manufacturing a semiconductor device according to claim 1, wherein the semiconductor substrate is a single-crystalline semiconductor substrate, and the first semiconductor layer and the second semiconductor layer is a single-crystalline semiconductor layer formed by epitaxial growth.

6. The method of manufacturing a semiconductor device according to claim 1, wherein the semiconductor substrate and the second semiconductor layer are made of single-crystalline silicon, and the first semiconductor layer is made of a single-crystalline silicon germanium.

7. The method of manufacturing a semiconductor device according to claim 1, wherein an insulating film is formed on the second semiconductor layer before the first groove is formed.

8. The method of manufacturing a semiconductor device according to claim 7, wherein the insulating layer includes at least a silicon nitride film.

9. A method of manufacturing a semiconductor device on a semiconductor substrate that has a first element region having a silicon-on-insulator structure (SOI) structure, a second element region having a bulk structure and an element isolation region separating each element region, the first region and the second region being provided in a plural number, the method comprising:

forming a mask in the second element region on the semiconductor substrate;

etching a part of a first area situated next to the first element region in the first element region and/or the element isolation region to a predetermined depth;

forming a first semiconductor layer made of a material that has a larger etching rate than an etching rate of the semiconductor substrate on the semiconductor substrate and the mask;

forming a second semiconductor layer made of a material that has a smaller etching rate than the etching rate of the first semiconductor layer on the first semiconductor layer;

removing the first semiconductor layer and the second semiconductor layer that exist in an unetched area;

forming a first groove in a second area where the first semiconductor layer and the second semiconductor layer are formed in the element isolation region, the first groove penetrating the first semiconductor layer and the second semiconductor layer and exposing the semiconductor substrate;

forming a supporting layer in the first groove and in at least a part of the first element region, the supporting layer supporting the second semiconductor layer on the semiconductor substrate;

forming a second groove in the element isolation region except an area where the first groove is formed, the second groove exposing the first semiconductor layer;

forming a cavity under the second semiconductor layer by removing the first semiconductor layer by etching the first semiconductor layer through the second groove; and forming a buried insulating layer embedded in the cavity through the second groove.

10. The method of manufacturing a semiconductor device according to claim 9, wherein the semiconductor substrate is exposed at the bottom of the second groove when the second groove is formed.

11. The method of manufacturing a semiconductor device according to claim 9, wherein a third groove is simultaneously formed in the element isolation region that separates each region in the second element region when the second groove exposing the first semiconductor layer is formed.

12. The method of manufacturing a semiconductor device according to claim 9, wherein the semiconductor substrate is etched to a depth substantially same as a sum of thicknesses of the first semiconductor layer and the second semiconductor layer when the part of the first area is etched.

13. The method of manufacturing a semiconductor device according to claim 9, wherein the semiconductor substrate is a single-crystalline semiconductor substrate, and the first semiconductor layer and the second semiconductor layer is a single-crystalline semiconductor layer formed by epitaxial growth.

14. The method of manufacturing a semiconductor device according to claim 9, wherein the semiconductor substrate and the second semiconductor layer are made of single-crystalline silicon, and the first semiconductor layer is made of a single-crystalline silicon germanium.

15. The method of manufacturing a semiconductor device according to claim 9, wherein an insulating film is formed on the second semiconductor layer before the first groove is formed.

16. The method of manufacturing a semiconductor device according to claim 15, wherein the insulating layer includes at least a silicon nitride film.

* * * * *